Dec. 23, 1969 H. J. FUMEA, JR., ET AL 3,486,039

TUNNEL DIODE LOGARITHMIC AMPLIFIER

Filed June 22, 1966 2 Sheets-Sheet 1

WITNESSES

Theodore F. Wrobel

James F. Young

INVENTORS
Harry J. Fumea, Jr.
and Robert W. Leech, Jr.
BY Ernest P. Klipfel
ATTORNEY United States Patent Office
3,486,039
Patented Dec. 23, 1969

3,486,039
TUNNEL DIODE LOGARITHMIC AMPLIFIER

Harry J. Fumea, Jr., Baltimore, and Robert W. Leech, Jr., Ellicott City, Md., assignors to Westinghouse Electric Corporation, Pittsburgh, Pa., a corporation of Pennsylvania Filed June 22, 1966, Ser. No. 559,434
Int. Cl. G06g 7/12
U.S. Cl. 307—230 7 Claims

ABSTRACT OF THE DISCLOSURE

A logarithmic amplifier for operation over wide dynamic ranges wherein a tunnel diode network is connected in each common emitter stage of the amplifier to provide a voltage gain characteristic curve for each stage which includes a linear small signal region and a large signal region. A variable resistor is connected with each tunnel diode network and selected to be of a magnitude which provides an incremental voltage gain of unity in the large signal region. Alternatively, the impedance of each stage can be adjusted to obtain the unit gain in the large signal region. The overall voltage gain of a plurality of such cascaded stages results in a logarithmic response.

The present invention relates generally to logarithmic amplifiers and more particularly relates to a tunnel diode logarithmic amplifier.

Logarithmic IF amplifiers capable of operating over wide dynamic ranges are often required in electronic systems, and are especially useful in signal-processing radars. A logarithmic amplifier provides an output which is proportional to the logarithm of the input. Such amplifiers are particularly desirable in high resolution receivers requiring higher than normal IF frequencies or wider bandwidths than normal.

The conventional successive detection logarithmic amplifier is limited in effective bandwidths because IF decoupling is required at the video output of each stage. The cascaded duo-gain logarithmic amplifier incorporating conventional diodes as non-linear feedback or load is limited in center frequency and bandwidth by diode capacitance and speed.

An object of the present invention is to provide a logarithmic amplifier having a wider bandwidth and shorter pulse rise and fall times than heretofore available.

A more particular object of the present invention is to provide a logarithmic amplifier capable of operation in the microwave region.

Another object of the present invention is to provide a logarithmic amplifier having greater efficiency and more small signal gain, requiring less cascaded stages for a given input dynamic range.

Another object of the present invention is to provide a logarithmic amplifier exhibiting less phase shift so that phase information may be better maintained.

Another object of the present invention is to provide a more stable logarithmic amplifier with respect to temperature variations than heretofore available.

Briefly, the present invention accomplishes the above cited objects by providing a network connected across the emitter biasing means in each common emitter stage of a logarithmic amplifier. The network includes first and second tunnel diode means connected in back-to-back relationship with resistance means connected across each tunnel diode and selected to match the impedance of the tunnel diode to provide a voltage gain characteristic curve for each state which includes a linear small signal region and a large signal region. A variable resistance means is serially connected with the tunnel diode-resistor configuration and selected to be of a magnitude which provides an incremental voltage gain of unity in the large signal region of the voltage gain characteristic curve of each common emitter stage. When desirable, the variable resistance means may be omitted and the magnitude of the load impedance or the emitter biasing means may be selected to provide an incremental voltage gain of unity in the large signal region. The overall voltage gain of a plurality of cascaded stages results in a logarithmic response. That is, the resultant output is proportional to the logarithm of the input signal.

Further objects and advantages of the present invention will be readily apparent from the following detailed description taken in conjunction with the drawing in which.

Figure 1:
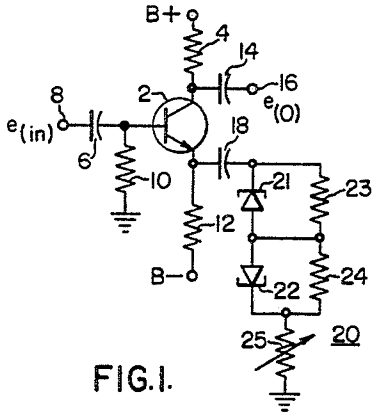
FIGURE 1 is an electrical schematic diagram of an illustrative embodiment of the basic circuit of the present invention.

A signal translating device such as, for example, a transistor 2 hereinafter referred to as such, is connected in a common emitter stage configuration. The transistor 2 is chosen to be of the microwave type. That is, its input and output capacitance can be neglected up to a frequency of approximately 10 kilomegacycles in accordance with the present stage of the art. The load resistor 4, including the equivalent collector resistance of transistor 2, connects the collector of the transistor 2 to a positive power supply, B+. Capacitor 6 connects the input signal $e_{(in)}$ received by the input terminal 8 to the base electrode of the transistor 2. Input resistor 10 connects the base electrode to a point of reference potential and includes the equivalent transistor input resistance. Emitter bias resistor 12 connects the emitter electrode of the transistor 2 to a negative power supply, B−. Output feed-through capacitor 14 connects output terminal 16 to the collector electrode of the transistor 2. An emitter bypass capacitor 18 connects a network 20 across the emitter biasing resistor 12.

Network 20 includes tunnel diodes 21 and 22 connected back-to-back. While devices 21 and 22 will hereinafter be referred to as tunnel diodes, it is to be understood that all devices exhibiting the characteristics "N" operating curve will herein meant to be included. Resistor 23 is connected across the diode 21 and resistor 24 is connected across the diode 22. The resistors 23 and 24 are matched to the tunnel diodes 21 and 22 to produce the characteristic gain operating curve shown in FIGURE 2. A linear small signal region A and a large signal region C are of primary interest as will be further detailed hereinafter. Variable resistor 25 connects the tunnel diode-resistor circuit to a point of reference potential. Resistor 25 may be advantageously used to control the incremental gain of region C of FIGURE 2, which gain is held at unity in that region.

Figure 3:
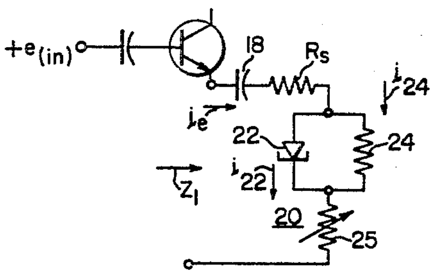
FIGS. 3 and 4 are simplified electrical schematic diagrams of a selected portion of the basic circuitry of FIGURE 1 for positive and negative excursions of input signals, respectively.
Figure 4:
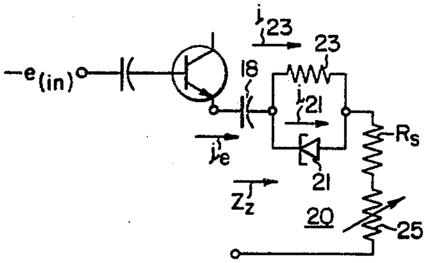

A simplified circuit diagram of the network 20 for positive excursions and negative excursions of the input signal $e_{(in)}$ is illustrated in FIGS. 3 and 4, respectively. Like components have been given the similar character references of FIG. 1.

Equivalent resistor $R_s$ for the tunnel diode-resistor combination for positive excursions and negative excursions per FIGS. 3 and 4, respectively, is determined by $$R_s = R_D || R_R = \frac{R_D R_R}{R_D + R_R} \quad (1)$$

where $R_D$ is the resistor 23 or 24 and $R_R$ is the reverse resistance of the tunnel diode 21 or 22.

From FIGURE 3, the impedance $Z_1$ presented by the network 20 is $$Z_1 = (R_s + R_{25}) + Z_{22} || R_{24} = (R_s + R_{25}) + \frac{Z_{22} + R_{24}}{Z_{22} \times R_{24}} \quad (2)$$

where $Z_{22}$=the impedance of the tunnel diode 22.

From FIGURE 3, the impedance $Z_2$ presented by the network 20 for negative excursions of input signal $e_{(in)}$ is $$Z_2 = (R_s + R_{25}) + Z_{21} || R_{23} = (R_s + R_{25}) + \frac{Z_{21} R_{23}}{Z_{21} + R_{23}} \quad (3)$$

where $Z_{21}$=the impedance of the tunnel diode 21.

If the tunnel diodes 21 and 22 are matched, each tunnel diode impedance $Z_D$ can be shown to be:

$$Z_D = Z_{22} = Z_{21} \quad (4)$$

and if resistors 23 and 24 are chosen to be equal so that each may be represented by a magnitude $R_D$ where $R_D = R_{24} = R_{23}$, Equations 2 and 3 are identical and become:

$$Z = Z_1 = Z_2 = (R_s + R_{25}) + Z_D || R_D = (R_s + R_{25}) + \frac{Z_D R_D}{Z_D + R_D} \quad (5)$$

where Z equals the total impedance of the network 20 for either positive excursion or negative excursions of the input signal. Equation 5 shows the bipolar operation is obtained. The positive and negative excursions of the input signal $e_{(in)}$ each feed the same magnitude of impedance Z presented by the network 20.

The output voltage $e_o$ of the circuitry shown in FIGURE 1 is given as:

$$e_o = e_{(in)} \frac{Z_c}{Z_e} \quad (6)$$

where $Z_c$=total collector impedance and $Z_e$= total emitter impedance. That is:

$$Z_e = R_{12} || Z = \frac{R_{12} Z}{R_{12} + Z} \quad (7)$$

where $R_{12}$ is the emitter biasing resistor 12 and Z is the total impedance of the network 20.

If the bias resistor 12 is made large compared to the network impedance Z, the total emitter imdedance $Z_e$ becomes:

$$Z_e \cong Z \quad (8)$$

Since the total collector impedance $Z_c$ is equal to the magnitude $R_L$ of the load resistor 4, Equation 6 becomes:

$$e_o = e_{(in)} \frac{R_L}{Z} = e_{(in)} \frac{R_L}{(R_s + R_x) + Z_D || R_D} \quad (9)$$

Figure 2:
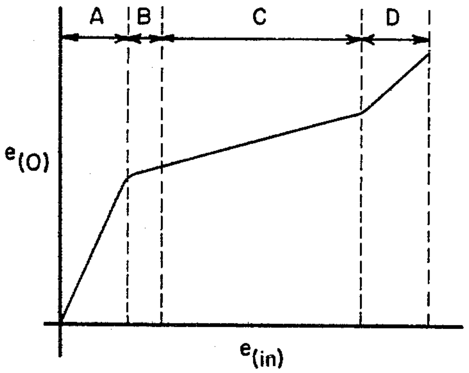
FIG. 2 is a graphical representation of a characteristic operating curve of the circuitry illustrated in FIGURE 1.
Figure 5:
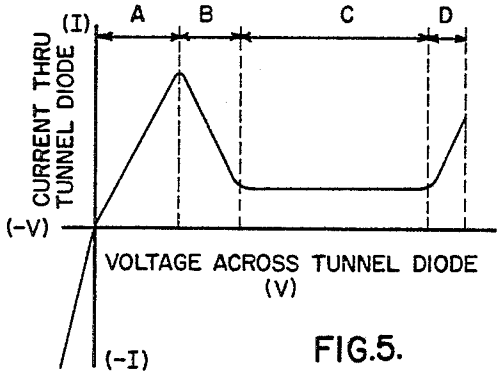
FIG. 5 is a simplified characteristic curve of a device utilized in the illustrative embodiment of FIGURE 1.

Equation 9 mathematically describes the characteristic operating curve shown in FIG. 2. It is to be noted that the impedance $Z_D$ of each of the tunnel diodes is nonlinear and can be divided into four approximately linear regions as shown in FIG. 5.

In region A, $Z_D$=positive and is small $=Z_{AD}$.
In region B, $Z_D$=negative and is small$=Z_{BD}$.
In region C, $Z_D$=positive and is large$=Z_{CD}$.
In region D, $Z_D$=positive and is small$=Z_{DD}$.

Throughout region A, the small signal region, Equation 9 becomes:

$$e_o = e_{in} \frac{R_L}{(R_s + R_{25}) + (Z_{AD} || R_D)} \quad (10)$$

Since $Z_{AD}$ is small and positive, the voltage gain is maximum, as shown in FIG. 2. A typical small signal gain is 10 db.

In the large signal region C, Equation 9 becomes:

$$e_o = e_{in} \frac{R_L}{(R_s + R_{25}) + (Z_{CD} || R_D)} \quad (11)$$

Since $Z_{CD}$ is positive and large, particularly when compared with $R_D$, $Z_{CD}||R_D$ is approximately equal to $R_D$. Since $Z_{CD}$ and $R_s$ are determined by the characteristics of the tunnel diodes, the magnitude $R_{25}$ of the variable resistor 25 is adjusted for a given magnitude $R_L$ of the load resistor 4 to give an incremental voltage gain of unity throughout region C. When desirable, the variable resistor 25 may be deleted, and the load resistor 4 or the emitter bias resistor 12 can be varied to provide unity incremental gain over region C, but this method would effect the direct current operating point of the transistor 2.

In region B, since $Z_{BD}$ is negative, the tunnel diode current $i_{21}$ or $i_{22}$ drops as the input signal $e_{(in)}$ increases and normally the total emitter current $i_e$ would remain constant or drop slightly if the current $i_{23}$ or $i_{24}$ through the parallel resistor did not rise enough to counteract the tunnel diode current drop. But, the magnitude $R_D$ of the parallel resistor is decreased to such a value to draw more current than the tunnel diode and the change in current through the parallel resistor swamps out the decrease in tunnel diode current, so that the total current increases. This inturn causes the output voltage $e_o$ to increase, effectively expending region A and C as shown in FIGURE 2. Region B is effectively decreased and results in a knee as shown in FIGURE 2. It should be noted that if the magnitude $R_D$ of the resistor in parallel with the tunnel diode is made too small, the tunnel diode action would be shorted out, and if resistance $R_D$ is made too large, the knee region B will expand destroying the desired result shown in FIGURE 2.

Region D is similar to region A. This region is not used because it would destroy the desired logarithmic characteristic. Therefore, when stages are cascaded to provide an overall logarithmic response, the input voltage $e_{(in)}$ of each stage is confined below region D.

It will now be explained why the output versus input curve shown in FIGURE 2 is necessary to produce a logarithmic response. The curve in FIGURE 2 approximates the duo-gain curve shown in FIGURE 6 wherein the two regions of interest are the small signal gain region A and the large signal gain region C.

Figure 6:
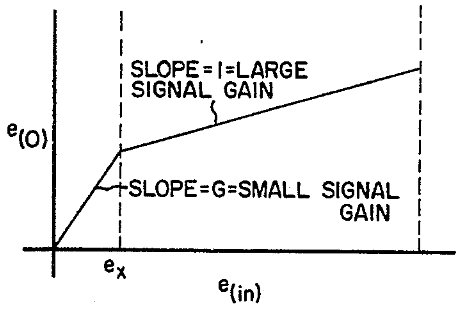
FIG. 6 is a simplified graphical representation of the characteristic operating curve of FIG. 2.

If N stages of FIGURE 6 are cascaded, the output of the $N^{th}$ stage is given as:

$$e_{(oN)} = n(G-1)e_x + G^{N-n} e_{(in)} \quad (12)$$

for $$\frac{e_x}{G^{N-n}} \ll e_{(in)} \ll \frac{e_x}{G^{N-n-1}}$$

where $N=n+1$ the number of cascaded stages.

Figure 7:
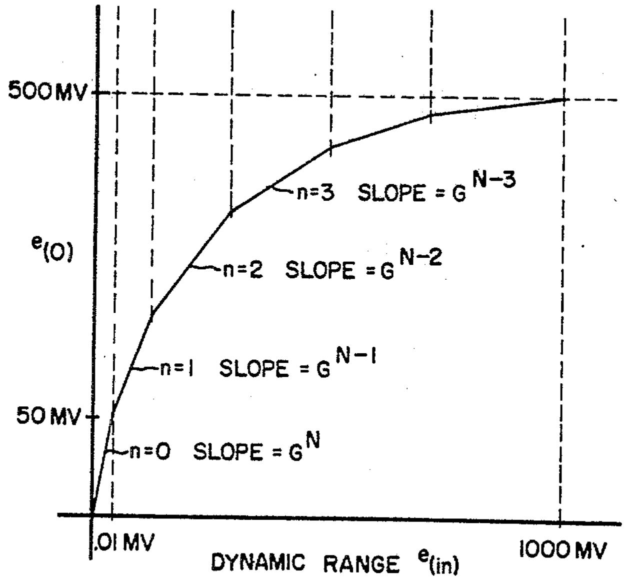
FIG. 7 is a graphical representation of the overall linear-logarithmic amplifier response of a cascaded number of stages such as illustrated in FIG. 1.

If the Equation 12 is plotted, the resulting logarithmic response is shown in FIGURE 7. When many stages are cascaded ($N$=large), the curve of FIGURE 7 approximates a linear-logarithmic characteristic. That is, it includes a linear small signal region and an approximately logarithmic large-signal region. The first segment ($n=0$) is the small-signal or linear region where the overall gain or slope is $G^N$. The following segment has a slope of $G^{N-1}$ and so on. The input dynamic range is equal to the overall small signal gain $G^N$. Since straight line approximations are being used, the maximum error or deviation from the true linear-logarithmic curve will increase as the gain/stage increases.

A design example using typical practical values illustrates the use of the equations previously derived. Typical values are:

$R_R=11$ ohms.
$R_D=150$ ohms.
$Z_{CD}=3000$ ohms.
$Z_{AD}=50$ ohms.
$R_L=160$ ohms.

The magnitude of resistance $R_{25}$ of the variable resistor 25 required to produce the desired logarithmic response is from Equation 1:

$$R_s=R_D||R_R=\frac{R_DR_R}{R_D\times R_R}=10 \text{ ohms}$$

The voltage gain $(e_0/e_{(in)})$ of region C must be equal to unity. From Equation 11

$$e_o/e_{in}=\frac{R_L}{(R_s+R_{25})+(Z_{CD}||R_D)}=1$$

Therefore $$R_{25}=R_L-Z_{CD}//R_D-R_s=160-143-10=7 \text{ ohms}$$

The small signal gain per stage is found from Equation 10

$$K_u=\frac{e_o}{e_{in}}=\frac{R_L}{(R_s+R_{25})+(Z_{AD}||R_D)}=\frac{160}{(10+7)+(50||150)}=2.78 \text{ or } 8.9 \text{ db}$$

Cascading ten such stages would produce a logarithmic amplifier with 89 db of logarithmic dynamic gain.

Figure 8:
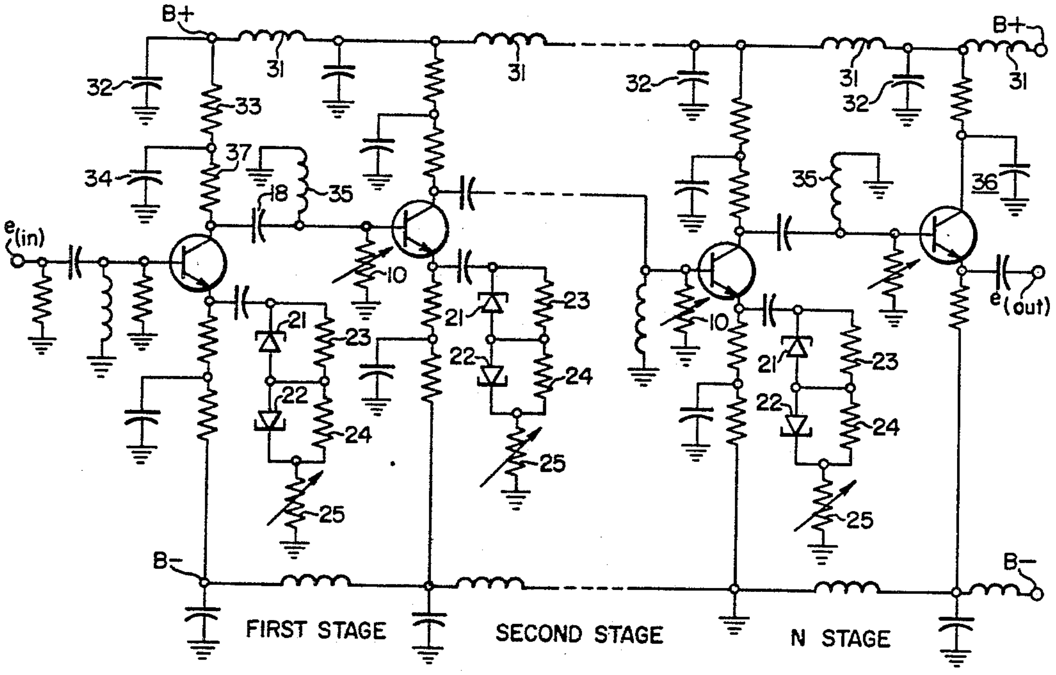
FIG. 8 is an electrical schematic diagram of a logarithmic amplifier including a plurality of cascaded stages as illustrated in FIGURE 1.

Six stage, seven stage, eight stage and nine stage tunnel diode logarithmic amplifier units have been built according to schematic diagrams shown in FIGURE 8. Each stage is in accordance with the basic circuit illustrated in FIGURE 1. Like reference characters have been assigned to the similar items of FIGURE 1. Series decoupling coils 31 block A.C. current while capacitors 32 bypass any spurious A.C. signal. Resistor 33 provides impedance to any spurious A.C. signal and capacitor 34 provides a bypass for any spurious A.C. signal. Each coil 35 provides means for tuning. When each tuning coil 35 is chosen to be 1.8 microhenries, the circuit tuned at 30 megacycles. An output stage 36 is of an emitter follower configuration which permits heavy loading of the multiple stage unit. The load impedance $R_L$ of each stage is composed of the collector resistor 37, the output capacitance of each stage, the coupling capacitor 18, tuning coil 35, input resistor 10, the input capacitance of the following stage, and all other strays. Since coil 35 forms a tuned circuit with all parallel capacitances, and since collector resistor 37 is made much larger than input resistor 10, input resistor 10 can be considered as the total effective load impedance.

In one embodiment the variable resistor 25 was made zero to maximize the gain in the small signal region, A. The effective load resistance $R_L$ of each stage was adjusted to produce unity incremental gain in the large signal region, C. For different load values, the resistors 23 and 24 in parallel with the tunnel diodes 21 and 22 must be changed to minimize output variations in the large signal region, C.

Using typical transistors and tunnel diodes such as type 2N918 and 1N3713, respectively, the maximum dynamic range obtained was 60 db. The minimum number of stages necessary to produce 60 db of range was five. Such dynamic range will be further increased with tunnel diodes of greater valley to peak voltage ratios as they become available in the art.

The best error obtained was ±0.5 db maximum over 60 db of range. This error was minimized by matching the effective load resistors to the tunnel diode parallel resistors. The optimum effective load resistor value was 120 ohms and the optimum parallel resistor value was 75 ohms. Conventional logarithmic amplifiers can produce errors of less than ±0.25 db over 90 db ranges and therefore are superior in this respect.

The maximum input signal that the tunnel diode logarithmic amplifier was capable of handling was 100 millivolts, which is at least 7 db below the maximum signal that conventional logarithmic amplifiers can handle. This is very good for microminiature applications where effective operation at low signal levels is important.

The measured bandwidth of the tunnel diode logarithmic amplifier using transistors of the 2N918 type was 100 megacycles per stage. A five stage unit would therefore have an overall bandwidth of 39 megacycles. Based on the input resistor 10 which is essentially the load impedance, being 120 ohms, bandwidths of 250 megacycles per stage or larger can be obtained if microwave transistors are used. This would be equivalent to a five stage unit exhibiting a 100 megacycle or larger overall bandwidth.

The tunnel diode logarithmic amplifier can be used in conventional solid state or microelectric applications, and is especially useful in high resolution radar systems. A vacuum-deposited thin film technique may be used to obtain the passive elements such as resistors and capacitors and interconnections within the circuit. The thin films were deposited on a glass substrate. The required active components such as transistors and tunnel diodes were attached to conductor pads on the thin film circuit by micro-soldering. The thin film component values and tolerances were obtained by controlling the area and thickness of the thin film deposits. Miniature powdered iron toroid cores were used to produce the coils 31 and 35 in the tuned circuit wafers for frequency tuning. The thin film circuits were fabricated in batches. That is, many circuits were produced in a single cycle.

Therefore, the thin film wafer is composed of four thin films and a glass substrate. Glass is used because it has the necessary highly polished surface required for thin coherent films. The glass substrate was of 0.410 inch square. The thin film was ultimately placed in a hermetically sealed encapsulation. The final thin film wafer measured 0.5 inch long, 0.5 inch wide, and 0.1 inch high. Resistors, conductors, lead attachment pads, and capacitor bottom plates are formed by photoetching continuous films of copper and chromium. The capacitor dielectric and top plate are formed directly by depositions through thin metal masks.

Thus, it is readily apparent that the present invention describes a unique method and apparatus of producing a logarithmic amplifier with many significant improvements over conventional logarithmic amplifiers. Tunnel diodes can operate in the microwave region. With the refinement of microwave transistors, the present circuit could conceivably produce a 10 kilomegacycles logarithmic amplifier.

Tunnel diodes can operate at lower levels, permitting smaller alternating current signal amplitudes. Direct current power dissipation requirements are also reduced since smaller signal amplitudes require less transistor bias. This is compatible with the micropower microelectronics concept which results in improved reliability.

The tunnel diode logarithmic amplifier has more small signal gain than conventional logarithmic amplifiers because of the lower tunnel diode forward impedance. Therefore, less cascaded stages are required for a given input dynamic range.

The tunnel diode logarithmic amplifier exhibits less phase shift than conventional logarithmic amplifiers because of the low tunnel diode junction capacitance, and the excellent tunnel diode matching characteristics needed for bipolar action. It is important that phase information be maintained.

Tunnel diodes exhibit excellent current versus temperature characteristics with proper choice of carrier concentration.

The bandwidth can be wider since impedance levels are lower than circuits using conventional diodes or other conventional logarithmic amplifier methods.

While the present invention has been described with a degree of particularity for the purposes of illustration, it is to be understood that all modifications, alterations and substitutions within the spirit and scope of the present invention are herein meant to be included. The present tunnel diode logarithmic amplifier offers higher center frequencies and larger overall bandwidths along with greater efficiency, more signal gain, improved phase stability, and better temperature stability. It should therefore be used where wide bandwidths and very short pulse rise and fall times are essential, such as in high resolution radar systems.

We claim as our invention:

1. A logarithmic amplifier comprising, in combination; a common emitter stage including an emitter bias impedance and a load impedance; a network connected across said emitter bias impedance; said network including first and second tunnel diodes connected in back-to-back relationship; a resistor for each tunnel diode connected thereacross, the resistors for each tunnel diode selected to match the impedance of the tunnel diodes to provide a voltage gain characteristic curve including a linear small signal region and a large signal region; and a variable resistor connected in series circuit combination within said network; said variable resistor selected to be of a magnitude which provides an incremental voltage gain of unity in said large signal region.

2. The amplifier of claim 1 where:

$$e_0 = e_{(in)} \times \frac{R_L}{(R_s + R_x) + Z_D \| R_D}$$

wherein $e_0$ is the output voltage from said common emitter stage, $e_{(in)}$ is the input voltage signal to said common emitter stage, $R_L$ is the load impedance, $R_s$ is the reverse impedance of one said tunnel diode, $Z_D$ is the forward impedance of one said tunnel diode, $R_D$ is the resistance of one said resistor connected with each tunnel diode and $R_x$ is the magnitude of said variable resistor.

3. The amplifier of claim 2 wherein the magnitude of impedance $R_x$ of the variable resistor is adjusted for a given magnitude of load impedance $R_L$ to provide an incremental voltage gain of unity throughout the region when the forward impedance drop of said tunnel diode is positive and large compared to the magnitude of the resistor $R_D$ connected with said tunnel diode.

4. The amplifier of claim 3 wherein the magnitude of said forward impedance drop is at least eight times greater than the magnitude of the resistor $R_D$.

5. A logarithmic amplifier comprising, in combination; an N plurality of cascaded stages; each stage including a transistor, including an emitter electrode, a collector electrode and a base electrode, connected in a common emitter configuration; load resistance means connected to the collector electrode in each stage; emitter bias resistance means connected to the emitter electrode in each stage; input means connected to the base electrode of said first stage; output means connected to the collector electrode of each stage; each succeeding stage coupled by its base electrode to the output means of a preceding stage; and a tunnel diode-resistor combination in the common emitter circuit of each stage and having an impedance when combined with said resistance means to provide a voltage gain characteristic curve for each stage which includes a linear small signal region and a substantially unity incremental gain over a large signal region; each n-succeeding stage providing a gain of $G^{N-n}$ to approximate a logarithmic response where $G^N$ is the overall gain of the small signal region.

6. The amplifier of claim 5 wherein the impedance magnitude of the emitter bias resistance means and the load resistance means is selected to provide an incremental voltage gain of unity through said large signal region for each said stage.

7. A logarithmic amplifier comprising, in combination; a plurality of cascaded stages; each stage including a transistor, including an emitter electrode, a collector electrode and a base electrode, connected in a common emitter configuration; load resistance means connected to the collector electrode in each stage; emitter bias resistance means connected to the emitter electrode in each stage; input means connected to the base electrode of said first stage; output means connected to the collector electrode of each stage; each succeeding stage coupled by its base electrode to the output means of a preceding stage; a tunnel diode-resistor combination in the common emitter circuit of each stage and having an impedance selected to provide a voltage gain characteristic curve for each stage which includes a linear small signal region and a large signal region; and a variable resistance means associated with each tunnel diode-resistor combination and selected to be of a magnitude which provides an incremental voltage gain of unity for each said stage in said large signal region.

References Cited

UNITED STATES PATENTS

| | | | |
|---|---|---|---|
| 3,090,926 | 5/1963 | Engel | 307—286 X |
| 3,235,746 | 2/1966 | Karnaugh | 307—286 |
| 3,250,919 | 5/1966 | Maass | 328—171 |
| 3,280,338 | 10/1966 | Lin et al. | 307—230 |
| 3,315,094 | 4/1967 | Mills | 307—237 |

JOHN S. HEYMAN, Primary Examiner

J. D. FREW, Assistant Examiner

U.S. Cl. X.R.

307—229, 237, 258, 322